United States Patent [19]

Mimura et al.

[11] Patent Number: 4,714,948
[45] Date of Patent: Dec. 22, 1987

[54] HEMT WITH EPITAXIAL NARROW BANDGAP SOURCE/DRAIN CONTACTS ISOLATED FROM WIDE BANDGAP LAYER

[75] Inventors: Takashi Mimura, Machida; Satoshi Hiyamizu, Komae, both of Japan

[73] Assignee: Fujitsu Limited, Kawasaki, Japan

[21] Appl. No.: 839,826

[22] Filed: Mar. 13, 1986

Related U.S. Application Data

[63] Continuation of Ser. No. 371,505, Apr. 23, 1982, abandoned.

[30] Foreign Application Priority Data

Apr. 23, 1981 [JP] Japan ................................. 56-61702

[51] Int. Cl.[4] .................... H01L 29/205; H01L 29/80
[52] U.S. Cl. ........................................ 357/22; 357/16; 357/55
[58] Field of Search .................... 357/22, 16, 50, 55, 357/22 A

[56] References Cited

U.S. PATENT DOCUMENTS

| | | | |
|---|---|---|---|
| 3,681,668 | 8/1972 | Kobayashi | 357/59 |
| 3,956,033 | 5/1976 | Roberson | 357/50 |
| 4,163,237 | 7/1979 | Dingle et al. | 357/16 |
| 4,291,327 | 9/1981 | Tsang | 357/23 |
| 4,424,525 | 1/1984 | Mimura et al. | 357/16 |

OTHER PUBLICATIONS

Mimura et al., "A New Field-Effect Transistor with Selectively Doped GaAs/n-AlGaAs Heterojunctions", *Japanese Journal of Applied Physics*, vol. 19, No. 5, May 1980, pp. L225-L227.

*Primary Examiner*—William D. Larkins
*Attorney, Agent, or Firm*—Staas & Halsey

[57] ABSTRACT

The present invention is related to an improvement of a high-electron mobility transistor (HEMT) which has an undoped GaAs layer and an N-doped AlGaAs layer a heterojunction formed between the undoped GaAs layer and the N-doped AlGaAs layer, respectively a gate electrode on the N-doped AlGaAs layer, and an electron-storing layer formed in proximity to the heterojunction due to the difference in electron affinity between the undoped GaAs layer and the N-doped AlGaAs layer. The known HEMT has a disadvantage in that during the formation of the source and drain regions by means of, for example, thermal diffusion, the impurities of the N-doped AlGaAs layer may diffuse into the undoped GaAs layer through the heterojunction so that the mobility of the electrons in the electron-storing layer is lessened. This disadvantage is removed in the present invention by the provision of a conduction layer formed by the epitaxial growth of highly-doped GaAs. The known HEMT also has a disadvantage in that the source electrode or the drain electrode is electrically connected to the N-doped AlGaAs layer so that the electrons in this layer may lessen the mobility. This disadvantage is also eliminated in the present invention by the provision of an insulating layer. The heterojunction may be formed between Gallium Aluminum Arsenide and Gallium Arsenide, Gallium Aluminum Arsenide and Germanium, Gallium Arsenide and Germanium, Cadmium Telluride and Indium Antimonide, or Gallium Antimonide and Indium Arsenide.

4 Claims, 14 Drawing Figures

HEMT WITH EPITAXIAL NARROW BANDGAP SOURCE/DRAIN CONTACTS ISOLATED FROM WIDE BANDGAP LAYER

This is a continuation of co-pending application Ser. No. 371,505, filed on Apr. 23, 1982, now abandoned.

BACKGROUND OF THE INVENTION

The present invention relates to a semiconductor device and a process for producing the same. More particularly, the present invention relates to an improvement of a high electron mobility transistor, hereinafter referred to as a HEMT, and an improved process for producing a HEMT.

The HEMT is one of the active semiconductor devices and its operating principle is completely distinguishable from that of the silicon ICs and the GaAs FETICs.

The HEMT has a first single crystalline semiconductor layer, a second single crystalline semiconductor layer having an electron affinity different from that of the first single crystalline semiconductor layer and forming a heterojunction with respectto the first single crystalline semiconductor layer, and a gate electrode on the second single crystalline semiconductor layer. An electron-storing layer is formed in proximity to the heterojunction due to the difference in the electron affinity and is used as the conduction channel of the HEMT. The electron mobility of the HEMT is approximately 10 times that of the GaAs FETICs and approximately 100 times that of the silicon ICs, at the temperature of liquid nitrogen (77K). The electron-storing layer mentioned above contains a quasi two-dimensional electron gas, the electrons of which gas being the predominant current-conduction carriers of the HEMT. In addition, the sheet-electron concentration of the quasi two-dimensional electron gas is controlled by applying voltage through the gate electrode. The impedance of the conduction channel is controlled by a pair of electrodes located beside the gate electrode. A very high electron mobility of the HEMT at a low temperature, for example at 77K, is due to the fact that the electron mobility of the quasi two-dimensional electron gas is very high at such a temperature where impurity scattering predominantly controls the electron mobility. The quasi two-dimensional electron gas is formed in proximity to the heterojunction, as stated above, and the thickness of the quasi two-dimensional electron gas is approximately the spreading amount of electron waves or on the order of ten angstroms. The relationship between the quasi two-dimensional electron gas and one of the single crystalline semiconductor layers which supplies the electrons into the electron-storing layer is a spatially separated one, with the result that the electron mobility of the quasi two-dimensional electron gas is not lessened due to the reduction of impurities in one of the single crystalline semiconductor layers. As a result, it is possible to achieve a very high electron mobility at such a low temperature where the electron mobility is predominantly controlled by impurity scattering.

The background of the present invention is explained more in detail with reference to FIG. 1.

Referring to FIG. 1, $E_{c1}$ indicates the energy of the electrons in the second single crystalline semiconductor layer having a low electron affinity, for example, an N-doped AlGaAs (aluminum gallium arsenide) layer, and $E_{c2}$ indicates the energy of the electrons in the first single crystalline semiconductor layer having a high electron affinity, for example, an undoped GaAs layer. Because of the difference in the electron affinity, a substantial part of the electrons in the N-doped AlGaAs layer are attracted to the undoped GaAs layer and quasi two-dimensional electron gas (2DEG) is formed as shown in FIG. 1 while the positively-ionized impurities (+) remain in the N-doped AlGaAs layer. The symbol "$E_F$" indicates the Fermi level, and the symbol "Ecg" indicates an energy gap, at the interface of the heterojunction, between the N-doped AlGaAs layer and the undoped GaAs layer. Two semiconductors capable of forming the heterojunction of the HEMT should have a sufficient difference in electron affinity, as was explained above. Furthermore, since the region near the interface of the heterojunction should be free of any crystal defects, the lattice constants of the two semiconductors should be close to one another. In addition, in order to attain a satisfactorily high energy gap (Ecg) at the interface of the heterojunction, the difference between the energy gap in the two semiconductors should be great. The types of semiconductors which satisfy the above-described three properties, i.e. electron affinity, lattice constant, and energy gap, are numerous, as shown in Table 1.

TABLE 1

| No. | Semiconductors | Band Gap (eV) | Lattice Constants (Å) | Electron Affinity (eV) |
|---|---|---|---|---|
| 1 | Aluminum gallium arsenide ($Al_{0.3}Ga_{0.7}As$) | 1.8 | 5.657 | 3.77 |
|   | Gallium arsenide | 1.43 | 5.654 | 4.07 |
| 2 | Aluminum gallium arsenide ($Al_{0.3}Ga_{0.7}As$) | 1.8 | 5.657 | 3.77 |
|   | Germanium | 0.66 | 5.658 | 4.13 |
| 3 | Gallium arsenide | 1.43 | 5.654 | 4.07 |
|   | Germanium | 0.66 | 5.658 | 4.13 |
| 4 | Cadmium telluride | 1.44 | 6.477 | 4.28 |
|   | Indium antimonide | 0.17 | 6.479 | 4.59 |
| 5 | Gallium Antimonide | 0.68 | 6.095 | 4.06 |
|   | Indium arsenide | 0.36 | 6.058 | 4.9 |

There are two types of operation of the HEMT, namely the normally on-type (depletion type) of operation and the normally off-type (enhancement type) of operation. The layer structure and the thickness of the first and second single crystalline semiconductor layers determine which type of operation the HEMT has. More specifically, in a case where the electron affinity of the second single crystalline semiconductor layer is greater than that of the first single crystalline semiconductor layer, the type of operation is the normally on-type when the metallurgical thickness of the second single crystalline semiconductor layer (upper layer) is greater than a certain critical amount. This certain critical amount depends on the aforementioned three parameters and on the properties of the gate which is to be formed on the upper layer. The type of operation is the normally off-type when the metallurgical thickness of the upper layer is smaller than the certain critical amount mentioned above. Similarly, in a case where the second (upper) and first (lower) single crystalline layers have a small and great electron affinity, respectively, the type of operation is the normally on-type when the metallurgical thickness of the lower layer is greater than a certain critical amount, which depends on the layer parameters. The type of operation is the normally off-type when the metallurgical thickness of the lower layer is smaller than the certain critical amount. The metallurgical thickness is hereinafter simply referred to as the thickness.

In the known HEMT, so that the input and/or output electrode can be electrically connected to the conduction channel with a low resistivity, one or both of the first and second single crystalline semiconductor layers are subjected to thermal diffusion so as to dope the layers with impurities at a high concentration to decrease the resistivity. Alternatively, one of or both of the first and second single crystalline layers are subjected to ion implantation followed by annealing of the implanted impurities for activation. Thermal diffusion and annealing after ion implantation are, however, undesirable with respect to the interface properties of one of the single crystalline semiconductor layers in which the electron-storing layer is to be formed. Especially when the heat treatment is carried out at such a temperature that the impurities contained in the other single crystalline semiconductor layer are liable to diffuse into one of the single crystalline semiconductor layers. The electron mobility in the electron-storing layer is lessened when the impurities are diffused in the electron-storing layer. Therefore, the impurities contained in one of the two single crystalline semiconductor layers of the HEMT having different electron affinities should be strictly spatially separated from the other layer, and judging from the fact that the quasi two-dimensional electron gas has a width of electron waves, the diffusion of a few atom layers of the impurities is detrimental to the high electron mobility of the conduction electrons. Without such a low resistivity region having a high impurity concentration between the electrode and the conduction channel composed of the quasi two-dimensional electron gas, the parasitic resistance between the electrode and the conduction channel cannot be lowered sufficiently even through an alloying of the electrode metal.

By such a low resistivity region, not only is ohmic contact between the electrode and one of these single crystalline semiconductor layers in which the electron-storing layer is formed, realized, but also an electrical connection between an electrode and the other single crystalline semiconductor layer is formed which supplies the electrons to the electron-storing layer. In every type of HEMT, the predominant conduction carriers should be the electrons in the quasi two-dimensional electron gas in the electron-storing layer, and, therefore, an output electrode of the HEMT must be electrically connected to the electron-storing layer. It is, however, unnecessary for an output electrode with a low resistivity to be electrically connected to one of the single crystalline semiconductor layers which supplies the electrons to the electron-storing layer. The electrical connection between an output electrode and one single crystalline semiconductor layer is rather harmful because the electrons in this layer have a low electron mobility which can generate current and thus decrease the operation speed of the HEMT. In the N-doped $Al_{0.3}Ga_{0.7}As$ layer, which is used as one of the single crystalline semiconductor layers for supplying the electrons to the electron-storing layer, the silicon atoms, i.e. the N-type conductivity impurities, do not have, at 77K, an energy exceeding the energy gap of the conduction band of the $Al_{0.3}Ga_{0.7}As$, with the result that the freezing of carriers occurs at 77K. The temperature at which the freezing of carriers occurs depends on the main composition of one single crystalline semiconductor layer and the kind of N-type conductivity impurities. When the HEMT comprising the N-doped $Al_{0.3}Ga_{0.7}As$ is to be operated at room temperature, the freezing of carriers does not occur but the free electrons generated from the silicon atoms can be one type of conduction carriers. Since the HEMT can be used at room temperature and exhibits an operation speed twice as high as that of conventional silicon ICs, it is important to prevent the electrons of the silicon atoms from participating in the generation of current.

SUMMARY OF THE INVENTION

It is an object of the present invention to improve a semiconductor device in which an electron-storing layer is formed in proximity to the heterojunction between the first and second single crystalline semiconductor layers, each layer having a different electron affinity. The electron-storing layer is used as a conduction channel, thereby providing an electrode with such a structure that the electrode is electrically connected to the conduction channel by means other than a high temperature heat treatment.

It is another object of the present invention to provide a process for producing the semiconductor device mentioned above, in which process the ohmic connection of the electrode to the conduction channel can be achieved by means of a deposition method in which the heterojunction does not undergo a high temperature heating which is detrimental thereto.

In accordance with the objects of the present invention, there is provided a semiconductor device having:

a first single crystalline semiconductor layer;

a second single crystalline semiconductor layer having an electron affinity different from that of the first single crystalline semiconductor layer;

a heterojunction formed between the first and second single crystalline semiconductor layers;

a gate electrode on the first single crystalline semiconductor layer;

an electron-storing layer for forming a conduction channel, formed in proximity to the heterojunction due to the difference in electron affinity;

a conduction layer composed of highly-doped and epitaxially grown semiconductor material in contact with the heterojunction; and an electrode electrically connected to the conduction channel via the conduction layer, the electrode being formed on the conduction layer.

In accordance with the present invention, there is provided a process for producing a semiconductor device having:

a first single crystalline semiconductor layer;

a second single crystalline semiconductor layer having an electron affinity different from that of the first single crystalline semiconductor layer;

a heterojunction formed between the first and second single crystalline semiconductor layers;

a gate electrode on the first single crystalline semiconductor layer; and an electron-storing layer for forming a conduction channel, formed in proximity to the heterojunction due to the difference in electron affinity, the process comprising the steps of:

selectively removing either or both of the first and second single crystalline semiconductor layers after the formation of the first and second single crystalline semiconductor layers, so as to expose an end of the heterojunction;

epitaxially growing a highly-doped semiconductor material where the end of the heterojunction is exposed after either or both of the first and second single crystalline layers are selectively removed, so as to form a conduction layer which is in contact with the exposed end of the heterojunction; and forming on the conduction layer an electrode electrically connected to the conduction channel via the conduction layer.

In the semiconductor device, i.e. the HEMT, of the present invention, it is not necessary to expose the HEMT during the production process, particularly during the step of forming the input and/or output electrode, to such a high temperature that diffusion of the impurities results, since the conduction layer of the present invention is not formed by means of either thermal diffusion or ion implantation. The conduction layer consists of an epitaxially-grown, highly-doped semiconductor material, that is, the impurities are not introduced into the conduction layer subsequent to its formation; rather, they are already present in the conduction layer when such layer is epitaxially grown.

According to an embodiment of the present invention, the second single crystalline semiconductor layer is doped with N-type conductivity impurities and has a smaller electron affinity than the first single crystalline semiconductor layer, and an insulating layer, which is formed by converting a surface of the second single crystalline semiconductor layer to an insulating layer, is interposed between the conduction layer and the second single crystalline semiconductor layer. In the embodiment, since the conduction layer is electrically insulated from the second single crystalline layer which supplies the electrons to the electron-storing layer, the electrons remaining in the second single crystalline layer cannot function as conduction electrons, i.e. the predominant carriers of the HEMT, and therefore the electron mobility of the predominant carriers is high when the frequency of the current is high, thereby making the HEMT of the present invention an improvement over conventional HEMTs.

DESCRIPTION OF THE PREFERRED EMBODIMENTS

Embodiments of the present invention are hereinafter described with reference to FIGS. 2 through 14, primarily with respect to a case where one of the single crystalline semiconductor layers having a great electron affinity is an undoped GaAs layer and the other having a small electron affinity is an N-doped AlGaAs layer.

Figure 1:
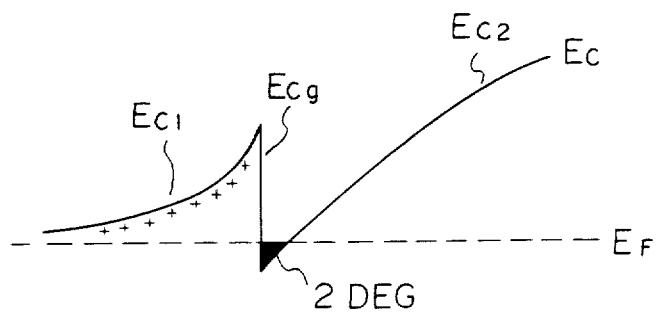
FIG. 1, schematically illustrates an energy diagram near the interface of the heterojunction of a HEMT.
Figure 2:
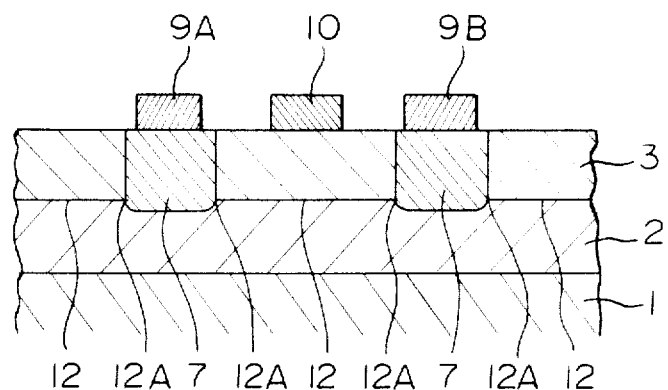
FIGS. 2 through 4 illustrate HEMTs according to several embodiments of the present invention.

Referring to FIG. 2, the substrate of the HEMT is denoted by reference numeral 1 and consists of semi-insulating GaAs (gallium arsenide) having a resistivity of approximately $10^9 \Omega cm$. On the substrate 1, the first single crystalline semiconductor layer 2 is epitaxially grown up to a thickness of approximately 0.2 micron and consists of undoped GaAs. On the first single crystalline semiconductor layer 2 the second single crystalline semiconductor layer 3 is epitaxially grown up to a thickness of 0.2 micron consists of N-doped $Al_{0.3}Ga_{0.7}As$ (aluminum gallium arsenide) containing silicon as N-type conductivity impurity at a concentration of approximately $1 \times 10^{18}/cm^3$. The crystal growth of the first and second single crystalline semiconductor layers 2 and 3, respectively, can be continuously carried out by means of an MBE method. In the case of molecular-beam epitaxial growth, the substrate 1 should be heated at a temperature from 500° to 700° C., preferably 590° C., within which temperature range, no substantial impurity diffusion occurs.

The second single crystalline semiconductor layer 3 is provided with grooves and the grooves are filled with conduction layers 7. The conduction layers 7 may be mainly composed of either GaAs or Ge and are highly doped with the N-type conductivity impurities. Highly-doped GaAs or the like can be deposited in the grooves by means of a conventional MBE method, but the employment of a gas-phase epitaxial growth method using organic metals as the starting materials is more preferable because a good step coverage characteristic can be expected in a gas-phase epitaxial growth method. In the case of the MBE method, the growth conditions can be the following: (1) initial degree of vacuum-$10^{-10}$ Torr; (2) degree of vacuum during crystal growth-$10^{-7}$ Torr; and (3) temperature-500°-700° C. Since the highly-doped GaAs or the like is epitaxially grown in the grooves, neither thermal diffusion of the N-type conductivity impurities nor ion implantation followed by annealing need be carried out after the formation of the conduction layers 7.

The source electrode 9A and the drain electrode 9B are formed on the conduction layers 7, and the gate electrode 10 is formed on the second single crystalline semiconductor layer 3. The source and drain electrodes 9A and 9B which are in ohmic contact with the conduction layers 7, respectively, consist of gold or a gold-germanium alloy while the gate electrode 10 consists of aluminum, titanium, platinum, gold, or the like and forms a Schottky barrier contact with the layer 3. These electrodes can be formed by means of a vacuum deposition method and photolithography. If necessary, a heat treatment for alloying the gold or the like with the underlying semiconductor layer 3 or conduction layers 7 can be carried out at a temperature of up to 450° C. The grooves are embedded with the conduction layers 7. The conduction layers 7 as seen in the completed HEMT, therefore, protrude through the second single crystalline semiconductor layer 3 until they reach the level of the heterojunction 12 between the first and second single crystalline semiconductor layers 2 and 3, respectively.

Figure 3:
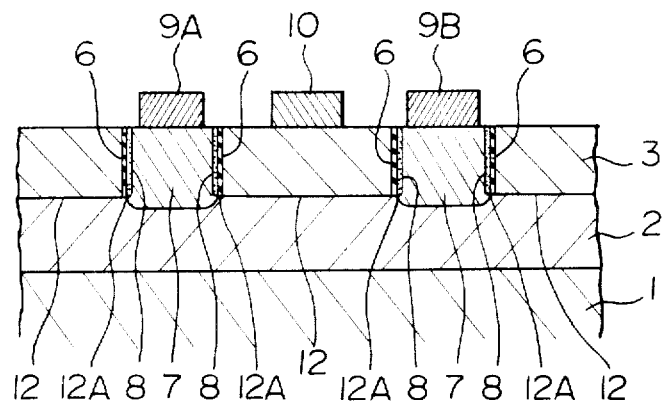

Referring to FIG. 3, the elements of the HEMT which are the same as those of the HEMT in FIG. 2 and are denoted by the same reference numerals. In the embodiment of the HEMT shown in FIG. 3, a surface of the second single crystalline semiconductor layer 3 is converted to an insulating layer 6 by oxidizing or nitrifying the semiconductor material of the second single crystalline semiconductor layer 3. The insulating layer 6 therefore consists of oxide or nitride containing the semiconductor material and is mainly composed of aluminum oxide ($Al_2O_3$) or aluminum nitride (AlN). When the conduction layers 7 are epitaxially grown in the grooves, part of the GaAs or the like, deposited on the insulating layer 6 is grown as an amorphous layer 8 having a high resistivity, while the other part of the GaAs or the like, deposited on the amorphous layer 8 and the exposed first single crystalline semiconductor layer 2, is epitaxially grown as a single crystal having a low resistivity. The conduction layers 7 consisting of a single crystalline GaAs or the like are therefore completely insulated from the second single crystalline semiconductor layer 3 by both the oxide or nitride and the amorphous layer 8 having high resistivity. This means that even an extremely thin insulating layer 6 of oxide or nitride formed on the second single crystalline semiconductor layer 3, which alone can otherwise cause a tunnel phenomenon or the direct conduction of current between such layer 3 and the conduction layers 7, may be used together with such an insulating amorphous layer 8 so as to achieve complete insulation.

Figure 4:
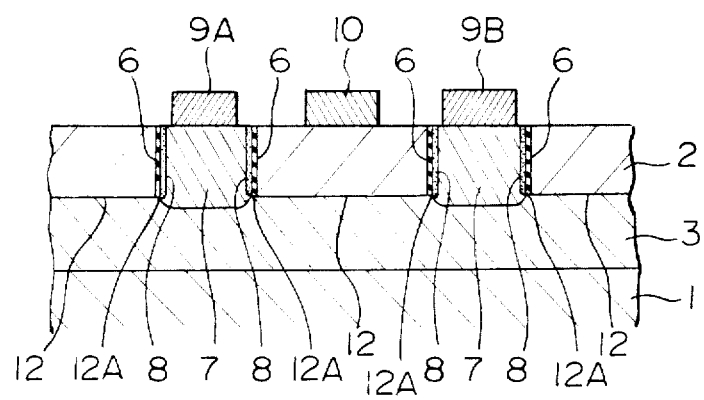
Figure 5:
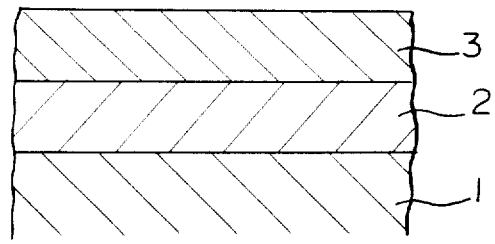
FIGS. 5 through 10 illustrate a process for producing the HEMT shown in FIG. 3.
Figure 6:
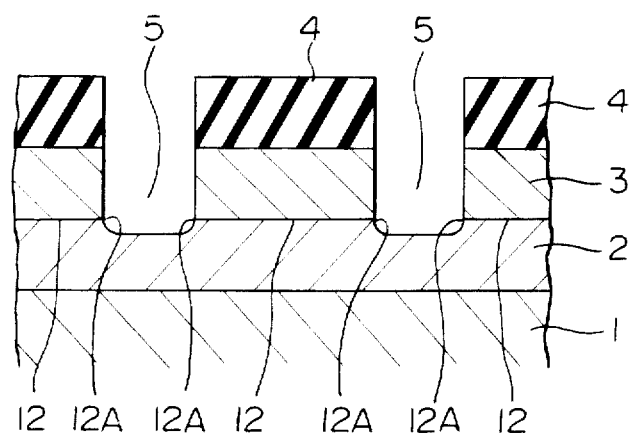

Referring to FIG. 4, the HEMT shown in this drawing has the same structure as the HEMT shown in FIG. 3 except that the position of the first and second single crystalline semiconductor layers 2 and 3, respectively, is reversed. Therefore, the electron-storing layer (not shown) is formed in the upper layer, i.e. the first single crystalline semiconductor layer 2, in proximity to the heterojunction 12 between the first and second single crystalline semiconductor layers 2 and 3, respectively. In order to selectively form, by means of a conventional method, ohmic contact between the source and/or drain electrodes and the first single crystalline semiconductor layer 2, a heat treatment for alloying the electrode material must be precisely carried out so that the electrode material is only alloyed with respect to the first single crystalline semiconductor layer 2. However, since such precisely controlled alloying by means of a heat treatment is difficult, the heat treatment leads to alloying of the electrode material with respect to not only the first single crystalline semiconductor layer 2 but also the second single crystalline layer 3. According to the present invention, since the insulating layer 6 insulates the conduction layers 7 from the first single crystalline semiconductor layer 2, it is easy to selectively form a current-conduction path between the source and/or drain electrodes 9A and 9B, respectively, and the first single crystalline semiconductor layer 2.

Referring to FIGS. 5 through 10, a process for producing a HEMT according the present invention is illustrated.

Undoped GaAs is epitaxially grown, by means of an MBE method, on the substrate 1, which consists of semi-insulating GaAs, so as to form a first single crystalline semiconductor layer 2 having a thickness of approximately 0.2 micron. Then the epitaxial growth of N-doped AlGaAs is carried out without interrupting molecular-beam epitaxial growth so that a second single crystalline semiconductor layer 3 is continuously grown on the first single crystalline semiconductor layer 2. The second single crystalline semiconductor layer 3 consists of N-doped $Al_{0.3}Ga_{0.7}As$ having an impurity concentration of approximately $1 \times 10^{18}/cm^3$ and has a thickness of 0.2 micron. The continuous epitaxial growth of the two layers mentioned above and an abrupt change in the main composition at the interface between the two layers can be simultaneously achieved by means of an MBE method.

By using a chemical vapor-phase deposition (CVD) method, a silicon dioxide layer 4 is formed on the second single crystalline semiconductor layer 3 and is subsequently selectively removed, by means of photolithography, from parts of the second single crystalline semiconductor layer 3 designated as the source and drain regions of the HEMT. The remaining part of the silicon dioxide layer 4 is used as a mask for the selective removal of the exposed second single crystalline semiconductor layer 3, and, as a result of such selective removal, grooves 5 are formed, preferably by means of a reactive plasma etching method, in which carbondichloride difluoride ($CCl_2F_2$) is used as the reactant. When reactive plasma etching is carried out, it is preferable to monitor the optical spectrum of the etched components (plasma gases) of the second single crystalline semiconductor layer 3, thereby stopping etching when the first single crystalline semiconductor layer 2 is exposed. That is, when the removal of the second single crystalline semiconductor layer 3 is completed, the aluminum component of the plasma gases is decreased to zero. Therefore a monitoring device, such as a photodiode, which can detect optical spectrum variations in accordance with the reactive plasma etching process, makes it possible to stop etching as stated above. Even though the first single crystalline semiconductor layer 2 is etched, the depth of etching is very small.

The parts of the second single crystalline semiconductor layer 3 designated as the source and drain regions of the HEMT are selectively removed as described above. As a result of selective removal, the ends 12A of the heterojunction 12 are exposed.

Figure 7:
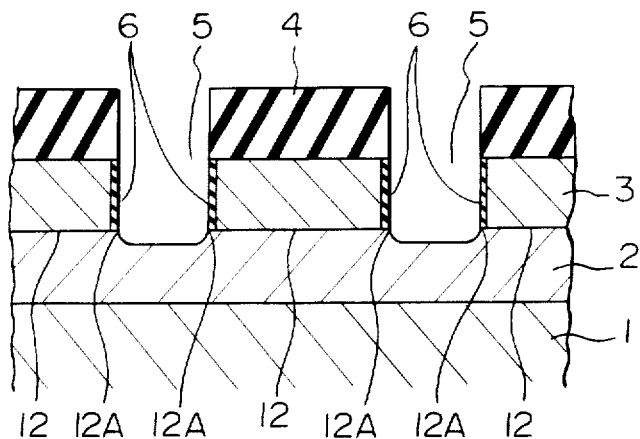
Figure 8:
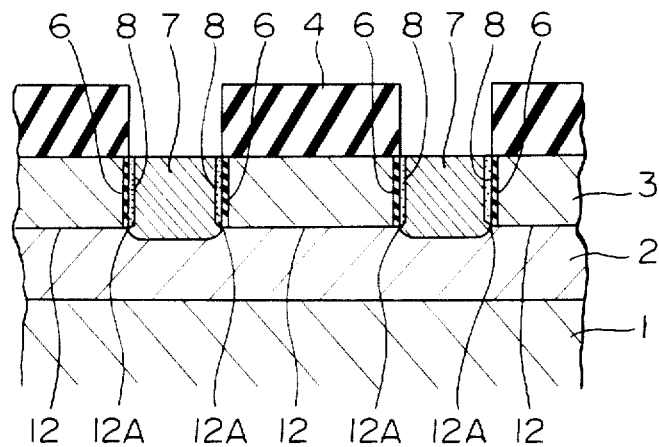

Subsequently, the surface of the grooves 5 of the second single crystalline semiconductor layer 3 is exposed to an oxygen or nitrogen atmosphere at room temperature for a period of at least 30 minutes. Such exposure may be carried out at an elevated temperature to promote oxidation or nitridation. As a result of such exposure, an insulating layer 6 is formed on the surface of each groove 5 (FIG. 7). The insulating layer 6 is mainly composed of aluminum oxide ($Al_2O_3$) or aluminum nitride (AlN) and has a thickness of approximately 10 angstroms. Thus, though the insulating layer 6 is very thin, it is stable enough and strong enough that it cannot be destroyed at a temperature of 600° C. at which temperature the heat treatment for epitaxial growth may be carried out. The first single crystalline semiconductor layer 2 exposed in the grooves 5 is exposed to an oxygen or nitrogen atmosphere, and thus an insulating layer is formed on such exposed layer 2. However, an insulating layer formed on such exposed first single crystalline semiconductor layer 2 can be easily sublimated at a temperature of about 600° C. during heat treatment before epitaxial growth, since the insulating layer is mainly composed of unstable arsenic oxide and is free of stable aluminum oxide and/or aluminum nitride.

A silicon dioxide layer 4 (FIG. 8) is again used as a mask, and the MBE method or a vapor-phase epitaxial growth method is carried out so as to epitaxially grow highly-doped GaAs or the like. The highly-doped GaAs or the like deposited on and grown on the exposed first single crystalline layer 2 is single crystalline and has a low resistivity while the highly-doped GaAs or the like deposited on and grown on the insulating layer 6 is amorphous and has a high resistivity. The amorphous highly-doped GaAs layer is denoted by reference numeral 8. Since the single crystalline highly-doped GaAs is highly conductive, it can be used as conduction layers 7 for providing a path of current between the source and/or drain electrodes (not shown)

and the conduction channel (not shown) formed in the first single crystalline semiconductor layer 2 in proximity to the heterojunction 12.

Figure 9:
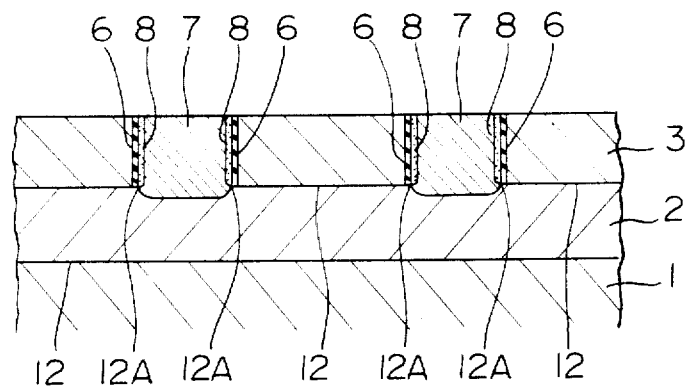

The silicon dioxide layer 4 used as a mask is removed as shown in FIG. 9. This removal can be simply accomplished by washing the silicon dioxide layer 4 in a hydrogen-fluoride solution containing hydrogen peroxide.

Figure 10:
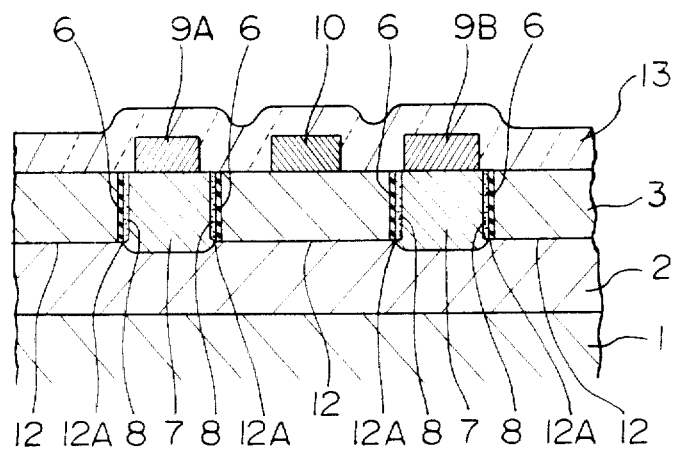
Figure 11:
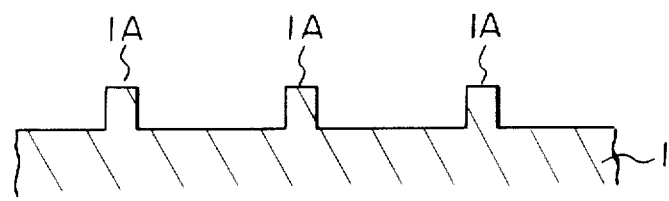
FIGS. 11 through 14 illustrate a process for producing a HEMT according to another embodiment of the present invention.
Figure 12:
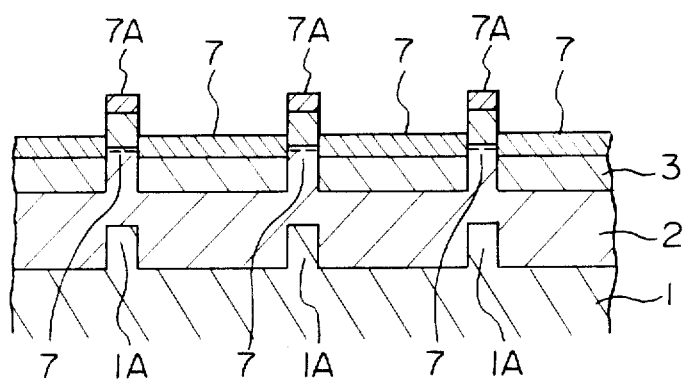

The completed HEMT is shown in FIG. 10. The source electrode 9A and the drain electrode 9B are formed by means of selective vacuum deposition of gold or a gold-germanium alloy. The gate electrode 10, which forms a Schottky barrier with respect to the second single crystalline semiconductor layer 3, is formed by means of selective vacuum deposition of aluminum, titanium, platinum, gold, or the like. On the top surface the HEMT is provided with a surface passivation film 13 and metal leads (not shown) for wire bonding.

Referring to FIGS. 11 through 14, a process for producing a HEMT is illustrated. The elements of the HEMT which are the same as those of the HEMTs shown in FIGS. 2 through 4 and are denoted by the same reference numerals.

The substrate 1 has lugs 1A at first parts thereof designated to be positioned below the gate electrodes (not shown). These lugs 1A are formed by, first, applying a photoresist film (not shown) on the substrate 1 and, second, selectively removing the photoresist film so that it remains only on the first parts and removing the exposed second parts of the substrate 1 by using the photoresist film (not shown) as a mask. To remove the exposed second parts of the substrate 1, an ion milling method utilizing argon ions, can be used. The height of the lugs 1A may be approximately 550 angstroms. The length of the lugs 1A may be approximately 2 microns. The lugs 1A must have a height exceeding the thickness of the second single crystalline semiconductor layer 3 (FIG. 12) for reasons explained below. The photoresist film (not shown) is finally completely removed by means of a known method.

In order that the first single crystalline semiconductor layer 2 can be formed, undoped GaAs is epitaxially grown on the first and second parts of the substrate 1 by means of an MBE method. The thickness of the first single crystalline semiconductor layer 2 may be approximately 0.6 micron. MBE growth is further continued without interruption so as to form the second single crystalline semiconductor layer 3. The N-doped $Al_{0.3}Ga_{0.7}As$ of this layer 3 may contain silicon as the N-type conductivity impurity at a concentration of $2 \times 10^{18}/cm^3$ and may have a thickness of approximately 300 angstroms. MBE growth is further continued without interruption so as to form the conduction layers 7. These layers 7 consist of N+-doped GaAs or Ge having an impurity concentration of $2 \times 10^{18}/cm^3$ and have a thickness of approximately 300 angstroms.

The substrate 1 is preferably rotated, during the MBE growth process, around an axis in the direction of the molecular beams, thereby preventing the lugs 1A from shading the deposition of semiconductor materials on, for example, the second parts of the substrate 1.

Figure 13:
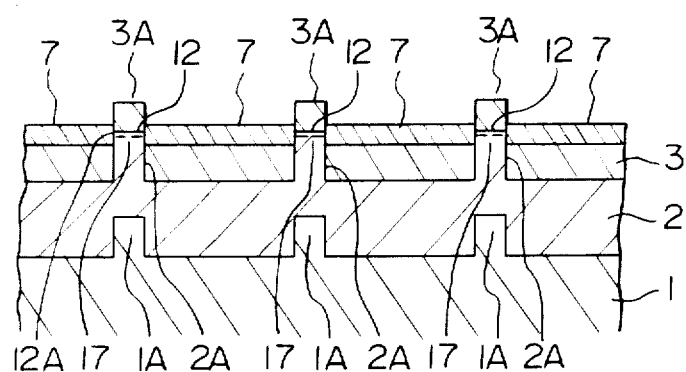
Figure 14:
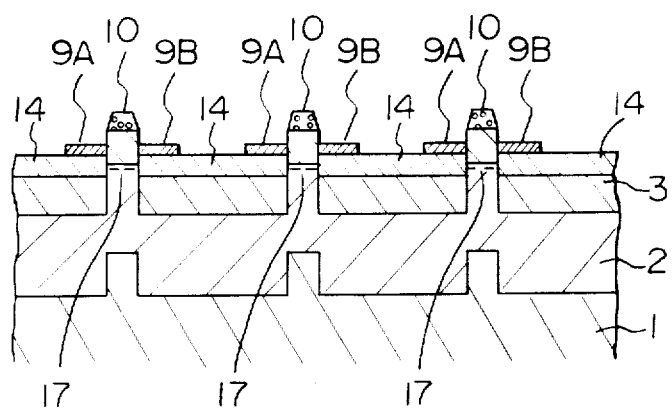

The ion milling method and photolithography are again carried out so that the parts of the conduction layers 7 in the form of lugs 7A (FIG. 13) are selectively removed as shown in FIG. 13.

The first and second single crystalline semiconductor layers 2 and 3, respectively, have such crystal parameters that electron-storing layers 17 are formed in each lug part 2A of said second layer 2 in proximity to the heterojunction 12. The conduction layers 7 are selectively left between the adjacent lug parts 3A of the second single crystalline layer 3 and are in contact with the ends 12A of the heterojuction 12. The source electrodes 9A and the drain electrodes 9B formed on the parts of the conduction layers 7 separated from one another (FIG. 14) are electrically connected to the electron-storing layers 17 serving as the conduction channel. Since an N+-doped GaAs or Ge of the conduction layers 7 is epitaxially grown by means of the MBE method or the like, neither thermal diffusion nor ion implantation followed by annealing, is necessary in order to make a low resistance ohmic connection. So that the separated parts of the conduction layers 7 are in contact with the ends 12A of the heterojunction 12, the lug parts 1A of the substrate 1 must have a thickness greater than the thickness of the second single crystalline semiconductor layer 3.

Either the first or second single crystalline semiconductor layer in which the electron-storing layer is formed should not be intentionally doped or should be undoped. "Undoped" means that the single crystalline semiconductor is essentially free of impurities. "Essentially free of impurities" means in turn that the impurity concentration is not exactly zero but is rather of such a value that impurity scattering is effectively decreased. Practically speaking, the impurity concentration of the undoped single crystalline semiconductor layer in which the electron-storing layer is formed may be approximately one tenth, at the highest, that of the other N-doped single crystalline semiconductor layer which has a less electron affinity, so as to supply electrons to the electron-storing layer.

Although the present invention is described hereinabove with respect to the normally on-type HEMT, the normally off-type HEMT can also be produced and also has the advantages described above.

According to a specific preferred example of the present invention, the semiconductor elements of the HEMT have the following crystal parameters.

| Semiconductor Layers | Main Composition | Thickness of Layers (angstroms) | Impurity Concentration (cm$^{-3}$) |
|---|---|---|---|
| First Single Crystalline Semiconductor Layer | GaAs | 2,000 | lower than $10^{15}$ (undoped) |
| Second Single Crystalline Semiconductor Layer | $Al_{0.3}Ga_{0.7}As$ | 600 | $2 \times 10^{18}$ |
| Conduction Layer | GaAs | 500 | $2 \times 10^{18}$ |

What is claimed is:
1. A semiconductor device comprising:
   a first single crystalline semiconductor layer;
   a second single crystalline semiconductor layer doped with N-type impurities, having an electron affinity less than that of said first single crystalline semiconductor layer, a heterojunction being formed between said first and second single crystalline semiconductor layers;
   a gate electrode formed on said second single crystalline semiconductor layer;
   an electron-storing layer for storing electrons and acting as a conduction channel, formed adjacent to said heterojunction and within said first single crystalline semiconductor layer, due to the difference in electron affinity between said first and second single crystalline semiconductor layers;

a pair of conduction layers comprising substantially the same semiconductor material as said first single crystalline semiconductor layer, being highly doped with N-type impurities, and extending through said second single crystalline semiconductor layer into said first single crystalline semiconductor layer to a depth level with the depth of said heterojunction and forming an epitaxial connection with said first single crystalline semiconductor layer;

an insulating layer, interposed between said conduction layers and said second single crystalline semiconductor layer, composed of oxide or nitride of said second single crystalline semiconductor layer; and a pair of electrodes, respectively, formed on said pair of conduction layers and electrically connected to said conduction channel via said conduction layer, said pair of electrodes electrically connected to each other through said conduction channel.

2. A semiconductor device according to claim 1, wherein said first single crystalline semiconductor layer comprises GaAs and said second single crystalline semiconductor layer comprises AlGaAs.

3. A semiconductor device according to claim 1, wherein said conduction layers comprise one member selected from the group consisting of GaAs and Ge.

4. A semiconductor device according to claim 1, wherein said insulating layer comprises aluminum oxide or aluminum nitride.

* * * * *

UNITED STATES PATENT AND TRADEMARK OFFICE
CERTIFICATE OF CORRECTION

PATENT NO. : 4,714,948

DATED : December 22, 1987

INVENTOR(S) : Takashi MIMURA ET AL.

It is certified that error appears in the above-identified patent and that said Letters Patent is hereby corrected as shown below:

Column 1, line 24, change "respectto" to --respect to--.

Signed and Sealed this

Twenty-first Day of June, 1988

Attest:

DONALD J. QUIGG

Attesting Officer

Commissioner of Patents and Trademarks